(12) United States Patent
Alonso

(10) Patent No.: US 7,107,183 B2
(45) Date of Patent: Sep. 12, 2006

(54) RECYCLABLE ELECTRIC JUNCTION BOX APPLICABLE TO AUTOMOTIVE VEHICLES

(75) Inventor: Juan Carlos Alonso, Valls (ES)

(73) Assignee: Lear Corporation, Southfield, MI (US)

( * ) Notice: Subject to any disclaimer, the term of this patent is extended or adjusted under 35 U.S.C. 154(b) by 54 days.

(21) Appl. No.: 10/904,364

(22) Filed: Nov. 5, 2004

(65) Prior Publication Data

US 2006/0100822 A1     May 11, 2006

(51) Int. Cl.
*G06F 19/00* (2006.01)
(52) U.S. Cl. .................. 702/182; 324/512; 701/34
(58) Field of Classification Search ........ 702/182–185, 702/188; 324/512; 700/1; 701/34
See application file for complete search history.

(56) References Cited

U.S. PATENT DOCUMENTS 6,434,512 B1 * 8/2002 Discenzo .............. 702/184

2002/0059156 A1   5/2002  Hwang et al. ............. 706/45
2005/0125117 A1 * 6/2005  Breed ....................... 701/29

FOREIGN PATENT DOCUMENTS

| EP | 0623900 A1 | 11/1994 |
|---|---|---|
| ES | 2178588 A1 | 12/2002 |
| JP | 06186281 A | 8/1994 |

* cited by examiner

*Primary Examiner*—Edward Raymond
(74) *Attorney, Agent, or Firm*—Bruce E Harang

(57) ABSTRACT

A recyclable electric junction box applicable to automotive vehicles, of the type comprising at least one casing housing a series of circuits inside materialized in one or more printed circuit boards with a series of electroconducting tracks on at least one of its sides, and with a series of components assembled on said plates, welded on said tracks and responsible for carrying out at least one power stage and one signal stage.

16 Claims, No Drawings

RECYCLABLE ELECTRIC JUNCTION BOX APPLICABLE TO AUTOMOTIVE VEHICLES

FIELD OF THE ART

The present invention is generally related to an electric junction box applicable to automotive vehicles, and particularly to an electric junction box having components which are monitored for recycling purposes.

PRIOR STATE OF THE ART

With the latest advances observed in the technology applied to the automotive field, a series of new devices has arisen in automotive vehicles, such as electric junction boxes which, even though they remarkably comply with their task, also provide a series of drawbacks which were not previously taken into consideration, such as a greater difficulty to locate a possible breakdown thereof. Another one of said drawbacks is the ecological impact said devices may have on the environment, once their useful life has concluded, if they are not correctly managed.

A series of proposals attempting to minimize said drawbacks are those provided by the following documents:

U.S. patent application 2002/0059156 (focused on reducing said difficulty in locating a possible breakdown) proposes a diagnostic device based on artificial intelligence for carrying out a concentrated management of electrical devices and of control of an automobile. One of the elements forming the device is an electric junction box diagnostic device for diagnosing the states of the different fuses and relays included in one of said junction boxes, and communicating the result of said diagnosis to the drive through several output means linked to a central diagnostic processing unit connected, among others, to said diagnostic unit of said electric junction box. Said diagnosis is not only focused on the electric junction boxes, and when it is focused on such boxes, it is focused only on the fuses and relays, without referring to other possible electrical or electronic components that the boxes may include. On the other hand, the diagnostic unit is not autonomous, since it needs the remaining elements of the device to carry out its function.

The objective of the proposal made in said document is clearly focused on the preventive maintenance and repair of malfunctioning vehicle parts, all this focused on a short term, i.e. the driver knows as soon as possible when a component of the vehicle begins to malfunction. The objective of the recycling is not posed in said application.

One example of an invention which is clearly focused on minimizing the previously mentioned drawback of the possible ecological impact said junction boxes have on the environment once their useful life has concluded is Spanish patent ES-A-2178588, granted to the present applicant, which relates to an interconnection, control and management box for an automobile with a reduced environmental impact.

Said environmental impact can mainly be reduced by manufacturing both the box and the components it houses with low ecological impact materials. For example and more specifically, it is proposed that the dielectric substrate of several printed circuit boards comprised in the box are made of a halogenated substance-free material, or that the weldings of a series of components connected to said printed circuit boards comprise a lead-free filler material. Another proposal provided in said patent is that of not excessively overloading said components, to that end the components are operatively intercoupled so that each one takes on multiple functions which will not be required at the same time or which are susceptible to simultaneously operating without excessively thermally loading the component involved. The reduction of the number of components, the size and final weight of the box, as well as the use of recycled plastics for the production of plastic parts, are also achieved with the proposed invention.

What said patent does not propose is the fact of recycling the entire junction box, since the proposal is centered on the different elements separately forming it.

EXPLANATION OF THE INVENTION

It is necessary to provide a novel proposal in terms of the recycling of junction boxes, as a whole or parts thereof, which allows re-installing said boxes in a vehicle when it is known that it is still in good conditions, either because not too much time has elapsed since they were manufactured or because their components have not been subjected to an excessive stress.

To reach the conclusion that one of said boxes is in good conditions, by means of the present invention, a diagnosis similar to the one proposed in the first previously described background is carried out, but besides being more thorough, not only focused on the fuses and relays, but also on the rest of the components and elements forming the box, it is directed in more of a long-term, specifically on when the box must be removed from the vehicle carrying it either to repair it or because the rest of the vehicle is rendered useless, for example, because of an accident. Therefore, the objective is completely different and clearly focused on recycling for reducing environmental contamination.

The present invention relates to a recyclable electric junction box applicable to automotive vehicles, of the type comprising at least one casing housing a series of circuits inside materialized in one or more printed circuit boards with a series of electroconducting tracks on at least one of its sides, and with a series of components assembled on said plates, welded on said tracks and responsible for carrying out at least one power stage and one signal stage.

The box furthermore comprises detection means for detecting a series of parameters or circumstances defining working conditions of at least said components, and an electronic system, associated and in collaboration with said detection means, for at least storing data representative of said parameters or circumstances in at least one memory comprised therein, which also incorporates, preferably from the factory, information concerning the box.

DETAILED DESCRIPTION OF SEVERAL EMBODIMENT EXAMPLES

The previous features and other features and advantages of the invention will become clearer from the following description of a series of embodiment examples, which must be taken in an illustrative and non-limiting manner.

The present invention relates to a recyclable electric junction box applicable to automotive vehicles, comprising a casing housing a series of circuits inside materialized in one or more printed circuit boards with a series of electroconducting tracks on at least one of their sides, and with a series of components assembled on said boards, welded on said tracks and responsible for carrying out at least one power stage and one signal stage.

The proposed box furthermore comprises detection means for detecting a series of parameters or circumstances defining working conditions of at least said components, and an electronic system, associated and in collaboration with said detection means, for at least storing data representative of said parameters or circumstances in at least one memory comprised therein.

For one preferred embodiment example, said detection means furthermore operate for detecting a series of parameters or circumstances defining working conditions of said electroconducting tracks.

The detection means comprise at least one temperature sensor, and preferably a plurality of temperature sensors, for detecting at least maximum temperatures and minimum temperatures, and at least one current sensor, and preferably a plurality of current sensors, for detecting at least maximum currents, both in the components and in the different areas of the electroconducting tracks, or in other parts of the box considered susceptible to undergoing critical temperatures and/or currents.

For one preferred embodiment example, the detection means furthermore comprise at least one voltage sensor, and preferably a plurality of voltage sensors, for detecting at least maximum voltages to which the components and/or electroconducting tracks are subjected.

By means of the mentioned sensors, it is possible to know if, for example, a component has been subjected to working conditions exceeding those for which it has been designed, which would obviously have an effect on decreasing the possibilities of the reuse thereof. Another one of the circumstances defining the working conditions of the box during its life is the stress to which it is subjected due to vehicle vibrations. It is because of this that the detection means furthermore comprise at least one accelerometer for detecting at least maximum vibration conditions in the box.

An additional, more elaborated embodiment includes at least one hydrometer in the detection means for detecting the internal humidity levels of the box exceeding a certain threshold, and thus verifying the correct functioning of the seal system it incorporates.

In addition to storing in a memory said data representing said parameters or circumstances which the box is experiencing, obtained as a result of the detection means detailed above, the same memory or other additional memories have stored, from the factory, a series of fixed data introduced at the origin related to information concerning the box and/or the content thereof.

Such information concerning the box comprises at least information of the group including at least: year of manufacture, manufacturer, total weight, hazardous material content, location thereof, recyclable material content, list of components that can be reused, information related to precautions to take into account for the disassembly of the box, or any other information considered appropriate for the purpose of knowing up to what point it can be reused, once a junction box is removed from a vehicle, with the desirable level of detail, or if this is not the case, which components can be recycled and/or reused. This information obviously can be, and in fact will be able to be, amplified and improved as new models of junction boxes arise, while the technology sustaining them evolves at the same time.

The electronic system is also adapted to obtain a series of data concerning the functioning of said components, related at least to the number of operations each one carries out and/or to the type and number of functions they carry out, the electronic system recording said functioning data in at least said memory.

The electronic system is adapted to access the data stored in the memory in order to manage it, process it and carry out a series of calculations with it, by means of which it carries out an estimate of the approximate remaining useful life of the box and records the results of said calculations and/or the result of said estimate in at least said memory.

It is deduced from the foregoing that there is a two-way nature between the memory and some elements of the electronic system which both record data in the memory and read it therefrom to carry out the mentioned calculations. At least one of said elements is a control chip, generally a microprocessor, having a two-way communication with said memory and with the sufficient calculation capacity for carrying out said task. With this, the person accessing the memory would directly obtain the results of the useful life estimate calculations, rather than the data, without needing to carry out additional calculations.

In order for the person interested in obtaining information concerning one of the proposed boxes, either a recycling operator or maintenance mechanic, to access said information, either solely the data or even the results of the explained calculations, the electronic system included in the box comprises at least one communication interface for transmitting the data stored in the memory/memories incorporating an external receiver, which is preferably connected to a computer, although instead of a computer, any other device external to the box which a person skilled in the art deems suitable for this purpose can be used, such as a hand-held reading terminal.

On the other hand, the communications can be carried out both directly through a connecting cable connected to said communication interface, and by a wireless system deemed suitable, such as is the case of infrared or radio frequency communication, for example.

In another embodiment example in which the electronic system does not have the necessary elements for carrying out said calculations, or simply for greater safety, it is possible to carry out the calculations by means of said device external to the box. Said computer is provided with software for managing and processing the data and carrying out therewith the mentioned calculations to finally carry out said estimate of the approximate remaining useful life of the box, and if said life is very short, i.e. the box is not completely reusable, to estimate the useful life remaining for the different components forming it for the purpose of taking advantage of them, for example, to be used as spare parts when repairing another similar box, thus reducing the ecological impact as only the components which, in a certain manner, cannot be reused are disposed of. Likewise, the external device will obtain information of how to correctly disassemble and manage the junction box, also called distribution box, if it is not reused in the end.

On the other hand, it is stressed that the proposed box will preferably be formed by low ecological impact materials, which will be duly indicated by means of the corresponding introduction of data related to information concerning the box in a corresponding memory, as has been explained above.

Evidently, when deciding if a box, or part of it, can be re-installed in a vehicle, safety issues will also be taken into account, i.e. a box in which it is not sure that it can function practically as if it were new will not be reused, safety of the vehicle occupants being priority over the recycling of the boxes.

On the other hand, it is finally indicated that a person skilled in the art could introduce changes and modifications in the described embodiment examples without exceeding the scope of the invention as it is defined in the attached claims.

What is claimed is:

1. A recyclable junction box for use in automotive vehicles comprising: a recyclable junction box casing suitable for housing; at least one printed circuit board having a plurality of electro-conducting tracks on at least one side, and further a plurality of components welded on said electro-conducting tracks, said plurality of components comprising at least one power stage and one signal stage; a detection means for determining the working condition parameters of said plurality of components including at least the type and number of operations carried out by each of said plurality of components; at least one memory component; an electronic system for storing said working condition parameters in said memory component, accessing data stored in said at least one memory component, process said data, and calculating an approximate useful remaining life of said recyclable junction box; and said recyclable junction box provides information to the operator or others as to how to safely disassemble and dispose of said box or components needing replacement.

2. A recyclable junction box according to claim 1, characterized in that said detection means further determines the working condition parameters of said electroconducting tracks.

3. A recyclable junction box according to claim 2, characterized in that said detection means comprises at least one temperature sensor and at least one current sensor.

4. A recyclable junction box according to claim 3, characterized in that said detection means further comprises at least one voltage sensor.

5. A recyclable junction box according to claim 4, characterized in that said detection means comprises: a plurality of temperature sensors for detecting at least maximum temperatures and minimum temperatures; a plurality of current sensors for detecting at least maximum currents; and a plurality of voltage sensors for detecting at least maximum voltages; said detections being carried out in at least said components.

6. A recyclable junction box according to claim 4, characterized in that said detection means comprises: a plurality of temperature sensors for detecting at least maximum temperatures and minimum temperatures; a plurality of current sensors for detecting at least maximum currents; and a plurality of voltage sensors for detecting at least maximum voltages; said detections being carried out in at least said different areas of said electro-conducting tracks.

7. A recyclable junction box according to claim 4, characterized in that said detection means comprises: a plurality of temperature sensors for detecting at least maximum temperatures and minimum temperatures; a plurality of current sensors for detecting at least maximum currents; and a plurality of voltage sensors for detecting at least maximum voltages; said detections being carried out in at least said components and different areas of said electro-conducting tracks.

8. A recyclable junction box according to claim 2, characterized in that said detection means further comprises at least one accelerometer for detecting at least maximum vibration conditions in said recyclable junction box.

9. A recyclable junction box according to claim 2, characterized in that said detection means further comprises at least one hydrometer for detecting internal humidity levels of said recyclable junction box which are above a certain threshold.

10. A recyclable junction box according to claim 2, characterized in that said electronic system comprises at least one microprocessor linked in a two-way connection to said at least one memory component.

11. A recyclable junction box according to claim 2, characterized in that said memory component has stored therein data introduced by the manufacturer related to said recyclable junction box and the contents thereof.

12. A recyclable junction box according to claim 11, characterized in that said data comprises at least the year of manufacture, manufacturer, total weight, hazardous material content, location thereof recyclable material content, list of components that can be reused, and information related to precautions during disassembly of said recyclable junction box.

13. A recyclable junction box according to claim 2, characterized in that said electronic system comprises at least one communication interface to transmit said data stored in said memory component to an external receiver.

14. A recyclable junction box according to claim 13, characterized in that said external receiver is connected to a computer.

15. A recyclable junction box according to claim 14, characterized in that said computer is provided with software for managing and processing said data, and for carrying out a series of calculations using said data.

16. A recyclable junction box according to claim 15, characterized in that said computer carries out an estimate of the approximate remaining useful life of said recyclable junction box and informs the user of the suitable treatment thereof and the possible recycling options at the end of the useful life of said recyclable junction box.

* * * * *